United States Patent [19]

Hilal

[11] Patent Number: 4,851,799
[45] Date of Patent: Jul. 25, 1989

[54] PRODUCING HIGH UNIFORMITY MAGNETIC FIELD OR MAGNETIC SHIELDING USING PASSIVE COMPENSATING COILS

[75] Inventor: Mohamed A. Hilal, San Diego, Calif.

[73] Assignee: General Dynamics/Space Systems Division, San Diego, Calif.

[21] Appl. No.: 66,929

[22] Filed: Jun. 29, 1987

[51] Int. Cl.⁴ .................. H01B 12/00; H01F 7/22
[52] U.S. Cl. ................................. 335/216; 335/301
[58] Field of Search .............. 335/211, 214, 216, 301, 335/304; 505/1

[56] References Cited

U.S. PATENT DOCUMENTS

| | | | |
|---|---|---|---|
| 3,193,734 | 7/1965 | Hempstead et al. | 335/216 |
| 3,239,725 | 3/1966 | Wiederhold | 335/216 |
| 3,370,258 | 2/1968 | Williams | 335/216 |
| 3,691,491 | 9/1972 | Massar et al. | 335/216 |

Primary Examiner—George Harris
Attorney, Agent, or Firm—John R. Duncan; Frank D. Gilliam

[57] ABSTRACT

The invention is directed to electromagnets for producing a high uniformity magnetic field or shielding a magnetic field by the use of passive compensation coils in the form of rings of superconductive material positioned perpendicularly adjacent to the electromagnet windings. Current induced into the rings of superconducting magnetic material establishing magnetic fields perpendicular to the electromagnetic magnetic field, thereby, depending on this size and quantity of the rings a highly uniform magnetic field or the cancelling of the magnetic field from the electromagnet adjacent to the surface of the rings remote from the electromagnet field occurs. High temeprature superconducting material can be used for the rings which lead to high temperature operation.

7 Claims, 2 Drawing Sheets

PRODUCING HIGH UNIFORMITY MAGNETIC FIELD OR MAGNETIC SHIELDING USING PASSIVE COMPENSATING COILS

BACKGROUND OF THE INVENTION

This invention relates to producing a uniform magnetic field or the shielding or cancelling a magnetic field produced by the use of superconductive passive rings positioned perpendicular to the electromagnet coil magnetic field between the coil and the resulting conditioned magnetic field. The size of, quantity of, and the material of construction of the superconductive passive rings determine the resulting conditioned field.

It has long been known that a high uniformity magnet field is required in many applications such as plasma separation and particle accelerators. Considering the allowable degrees of design freedom, a desirable high uniformity cannot be achieved by design alone. Correction or compensation coils are required to accomplish the high degree of uniformity required for these certain and other applications. Generally active compensation coils are used comprising a separate winding which is charged to the desired current distribution to promote high uniform density. In this appication active compensation coils are positioned between the source of the principle magnetic field and the resulting conditional or uniform field, i.e. around the inside of a cylindrical bipolar magnet or around the outside surface thereof. In this application the active coils are sized ad energized to establish a magnet field which passes and distributes a highly uniform magnetic field from the principal field external of the active compensation coils.

Shielding is established by increasing the field created by the active compensation coils to a degree that these fields are sufficient to neutralize the principal magnetic field exterior of the active compensation coils.

An example of active compensation coils for the neutralizing (shielding) the principal magnetic field can be found in U.S. Pat. No. 3,671,902 by William F. Westendorp and assigned to the General Electric Company and U.S. Pat. No. 4,032,959 by Roger W. Boom et al. and assigned to Wisconsin Alumni Research Foundation.

Although no specific prior art directed to establishing highly uniform fields by use of active magnetic coils was found in a search of the prior art, it is believed that, this type of magnetic field conditioning does exist in the art, and a uniform field would be produced by reducing the current used for shielding in the active compensating coils to a degree of intensity less than that required to neutralize the magnet effect of the principal field.

There is a continuing need especially in high magnetic field applications to establish high uniformity and shielding.

SUMMARY OF THE INVENTION

In accordance with the invention, passive means rather than active means is employed for the purpose of conditioning a strong magnetic field of non-uniformity to produce a highly uniform magnetic field therefrom or to shield that non-uniform magnetic field.

As an example a magnetic field is produced by an electromagnet wound on a rigid cylindrical form of non-magnetic material. To provide high uniformity to that field, a plurality of rings of superconductive material are placed adjacent to the magnetic field and perpendicular thereto. The field induced into these rings creates magnetic fields of less intensity and perpendicular to the axial magnetic field produced by the coil. The ring magnetic fields have less strength due to their physical design.

To shield or neutralize the magnetic field produced by the coil, the rings produce a field in the radial direction at least equal to the radial field produced by the coil.

Cooling means is provided to maintain the main coil if superconducting and rings in a superconducting state during operation. High temperature super conductor can be used as this film to make the rings and thus requires no cooling or liquid Nitrogen cooling.

An object of this invention is to provide passive means for producing a highly uniform magnetic field.

Another object of this invention is to provide passive means for shielding a magnetic field.

These and other objects of the invention will be pointed out in the following description and claims illustrated in the accompanying drawings, which disclose, by way of examples, the principles of the invention and the best mode, which has been contemplated, of applying that principle.

DESCRIPTION OF THE EMBODIMENTS

Figure 1:
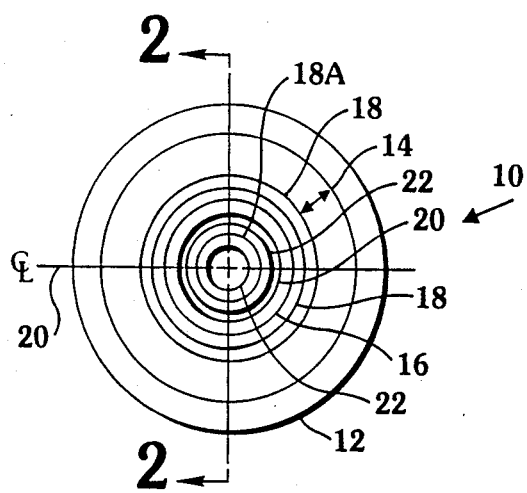
FIG. 1 is an end view schematic showing of the first embodiment of the invention.

FIG. 1 depicts an end view showing of an electromagnet 10 for producing a highly uniform magnetic field.

A vacuum vessel 12 contains a solenoid coil 14 surrounded by a coolant (if required) barrier 16. A fiberglass cylinder 18 or a cylinder constructed of any suitable non-magnetic material, is positioned within the barrier 16. Fiberglass cylinder 18 contains a plurality of spaced apart passive superconductor rings extending through its thickness. These rings create a magnetic field when solenoid coil 14 is energized. The rings are sized and spaced apart so taht they establish a magnetic field having a density less than the magnetic field produced by the solenoid coil. In this manner, the magnetic field produced by the solenoid which is not highly uniform by the nature of any best mode of construction is made highly uniform by the passive rings and evidence such uniformity along the center line 20 adjacent to the fiberglass cylinder 18.

Figure 2:
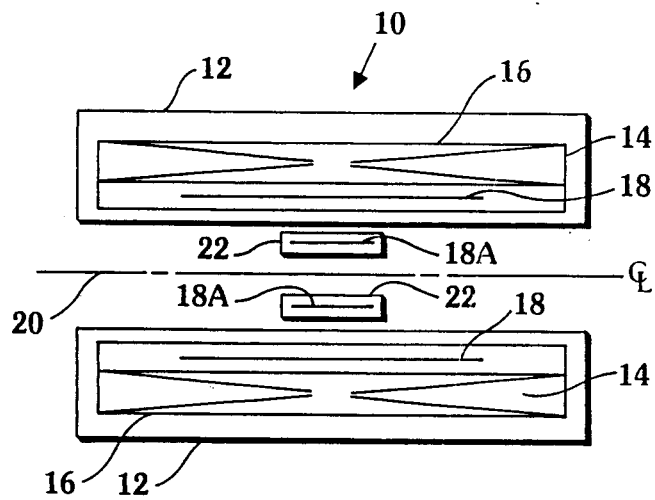
FIG. 2 is a cutaway side view schematic showing taken along line 2—2 of FIG. 1.

An alternate location of the cylinder 18 is shown as 18A in FIG. 2. In this fiberglass cylinder (18A) a container 22 of coolant or the like encloses the cylinder.

Figure 3:
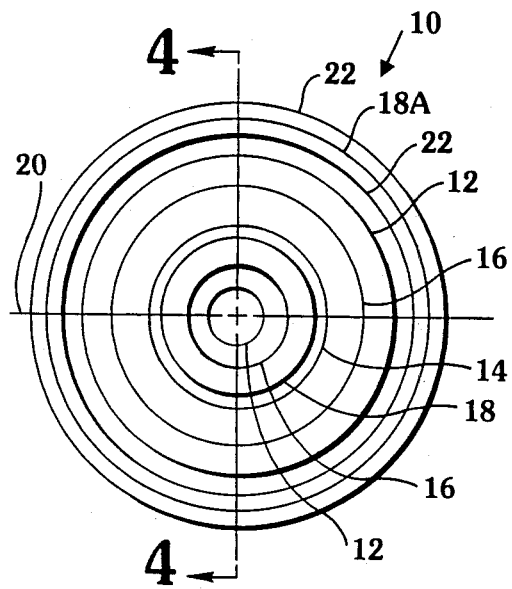
FIG. 3 is an end view schematic showing of a second embodiment of the invention.
Figure 4:
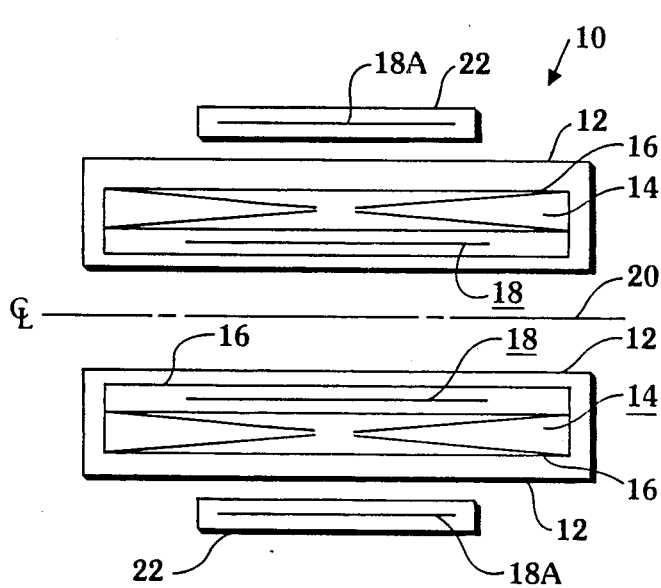
FIG. 4 is a cutaway side view schematic showing taken along line 4—4 of FIG. 3.

Showings similar to FIG. 1 and 2 are depicted in FIGS. 3 and 4. In these showing the cylinder 18 is positioned within the coolant barrier 12 or positioned outside of the barrier and shown as 18A positioned within a separate helium container 22. In the embodiment the passive compensation rings, hereiafter described in detail, carried by the fiberglass cylinder 18 are designed and positioned so that when magnetized by induction from solenoid coil 14 the magnetic field created thereby and perpendicular thereto is equal to or slightly less than the magnetic field from the solenoid coil thereby causing cancellation or shielding or any magnetic field.

Figure 5:
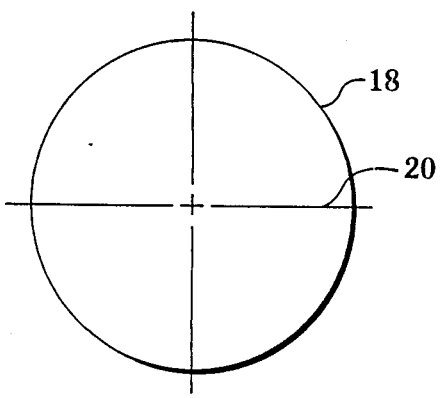
FIG. 5 is an end view of the cylindrical form supporting the passive compensation coils.
Figure 6:
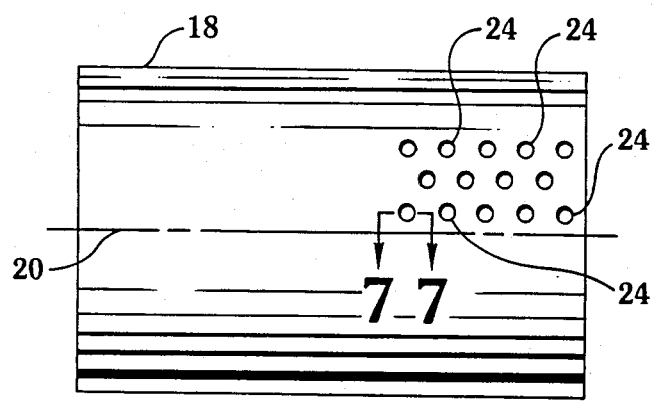
FIG. 6 is a side view of the cylindrical form supporting the passive compensation coils.

Referring now to FIGS. 5 and 6, the fiberglass cylinder 18 is shown in an end and side views respectfully. As can be seen in FIG. 6 a plurality of apertures 24 extend through the surface of cylinder 18. Although only a few are shown for illustration, the entire surface includes similar spaced apart apertures 24.

The apertures contain superconducting material, and example being material such as NbTi or the like. High temperature superconducting film can also be deposited usig a silicon cylinder instead of fiberglass epoxy.

Figure 7:
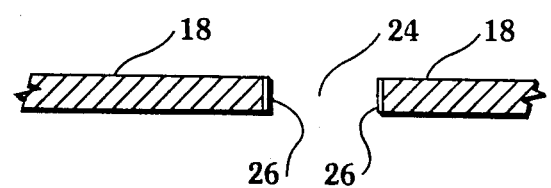
FIG. 7 is a sectional views taken along line 7—7 of FIG. 6.

As shown in FIG. 7, the walls of apertures 24 are lined with superconducting material 26 such as tape, sputter deposited, vapor deposit or the like.

Figure 8:
Figure 9:
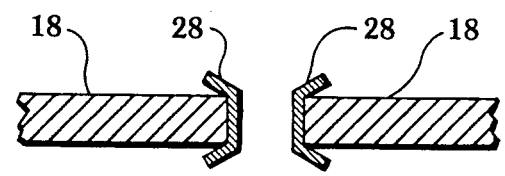
Figure 10:
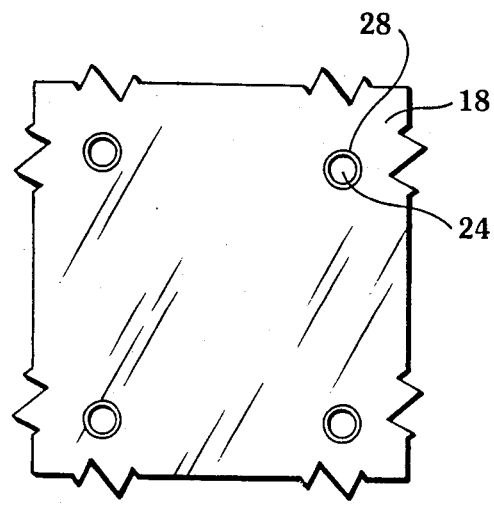

As shown in FIGS. 8-10, the superconducting rings may take the form of bushings 28. The bushing 28 are inserted through the apertures 24 and formed as shown in FIG. 9. A section of cylinder 18 with bushings 28 installed is shown in FIG. 10.

Although helium has been described as the superconducting cooling medium it should be understood that as superconductors with increased temperature characteristics are developed any cooling medium may be employed that provides the required superconducting temperature.

Although the form described for the solenoid and fiberglass passive compensation coil support take the form of a cylinder other forms will work equally as well to practice this invention.

This invention is directed to the theory that passive compensation means can be employed to increase the uniformity of magnetic field and shield magnetic fields from external penetration.

Since various changes and modifications may be made in the invention without departing from its spirit and essential characteristics, it is intended that all matter contained in the description shall be interpreted as illustrative and not in a limiting sense, the scope of the invention being defined by the appended claims.

What is claimed is:

1. In a cylindrical superconducting coil having a winding for producing a magnetic field comprising:
   a cylindrical form having a hollow central area constructed of a suitable non-magnetic material on which said superconducting coil is wound and physically supported;
   a second cylindrical form having a hollow central area constructed of a suitable non-magnetic material selectivity positioned within said hollow central area of said cylindrical form and a plurality of apertures of selected size through the surface thereof;
   a ring of superconducting material positioned in each of said apertures; and
   cooling means for maintaining said superconducting coil and the superconducting rings in their superconducting state.

2. The invention as defined in claim 1 wherein when said electromagnet coil is energized for producing said magnetic field and said electromagnet coil and said plurality of rings are in their superconducting state the size of the apertures and rings are selected so that strength of the magnetic field produced by each ring is less than the strength of the magnetic field produced by said electromagnet coil in the area of said each ring thereby establishing a magnetic field of high uniformity in said hollow central area of said second cylindrical form.

3. The invention as defined in claim 1, wherein when said superconducting coil is energized for producing said magnetic field and said electromagnet coil and said plurality of rings are in their superconducting state, the size of the apertures and rings are selected so that the strength of the magnetic field produced by each ring is at least equal to the magnetic field produced by said superconductive coil so as to neutralize the strength of the magnetic field produced by said magnetic coil in the area of said ring, thereby shielding the magnetic field produced by said electromagnet coil.

4. The invention as defined in claim 2, wherein said second cylindrical form is selectively positioned in the exterior of said electromagnet coil.

5. The invention as defined in claim 1, wherein said plurality of rings are each formed of a tape of superconducting material conforming to the surface forming each aperture.

6. The invention as defined in claim 1, wherein said first cylindrical form and said second cylindrical form are constructed of fiberglass.

7. The invention as defined in claim 1, wherein said ring of superconducting material is in the form of a bushing inserted in each of said plurality of apertures.

* * * * *